(12) United States Patent
Chen

(10) Patent No.: US 6,306,724 B1
(45) Date of Patent: Oct. 23, 2001

(54) METHOD OF FORMING A TRENCH ISOLATION STRUCTURE IN A STACK TRENCH CAPACITOR FABRICATION PROCESS

(75) Inventor: Ih-Chin Chen, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1512 days.

(21) Appl. No.: 08/495,960

(22) Filed: Jun. 28, 1995

Related U.S. Application Data

(63) Continuation of application No. 08/175,862, filed on Dec. 30, 1993, now abandoned.

(51) Int. Cl.[7] ...................................................... H01L 21/76
(52) U.S. Cl. ........................ 438/435; 438/430; 438/437; 438/387
(58) Field of Search ................................. 437/52, 67, 69, 437/72, 430, 435, 437, 387, 388; 148/DIG. 50

(56) References Cited

U.S. PATENT DOCUMENTS

| | | | |
|---|---|---|---|
| 4,621,414 | * 11/1986 | Iranmanesh | 437/69 |
| 4,631,803 | * 12/1986 | Hunter et al. | 437/67 |
| 4,700,464 | * 10/1987 | Okada et al. | 437/67 |
| 4,734,384 | * 3/1988 | Tsuchiya | 437/52 |
| 4,810,668 | * 3/1989 | Ito | 437/72 |

(List continued on next page.)

FOREIGN PATENT DOCUMENTS

| | | | |
|---|---|---|---|
| 0170950 | * 7/1988 | (JP) | 437/67 |
| 0078247 | * 3/1990 | (JP) | 437/67 |

OTHER PUBLICATIONS

B.W. Shen, G. Chung, I.C. Chen, D.J. Coleman, Jr., P.S. Ying, R. McKee, M. Yashiro, and C.W. Teng, "Scalability of a Trench Capacitor Cell for 64MBit Dram", Semiconductor Process and Design Center, MOS Memory Division, Semiconductor Group, Texas Instruments, Dallas, Texas, pp. 1–4, no date.

K. Sunouchi, F. Horiguchi, A. Nitayama, K. Hieda, H. Takato, N. Okabe, T. Yamada, T. Ozaki, K. Hashimoto, S. Takedal, A. Yagishita, A. Kumagae, Y. Takahasi, and F. Masuoka, "Process Integration for 64M DRAM Using An Asymmetrical Stacked Trench Capacitor (AST) Cell ", IEEE, pp. 647–650, 1990.

*Primary Examiner*—Trung Dang
(74) *Attorney, Agent, or Firm*—W. James Brady, III; Frederick J. Telecky, Jr.

(57) ABSTRACT

A trench isolation structure can be formed in a stack trench capacitor fabrication process by forming a trench region (18) through a buffer layer (16) and an interface layer (12) and into a semiconductor substrate (14). A trench wall layer (20) is grown on inner walls of the trench region (18) and in contact with the interface layer (12). A trench filler layer (28) is formed on the buffer layer (16) and on the trench wall layer (20) within the trench region (18). The trench filler layer (28) is removed from the buffer layer (16) but remains within the trench region (18). A storage dielectric (30) is deposited on the buffer layer (16) and on the trench filler layer (28) within the trench region (18). A field plate layer (32) is deposited on the storage dielectric (30) and within the trench region (18). The field plate layer (32), the storage dielectric (30), the buffer layer (16), and the interface layer (12) lying outside the trench region (18) are removed. A trench cap layer (38) is formed on the semiconductor substrate (14) such that the trench filler layer (28), the storage dielectric (30) and the field plate layer (32) within the trench region (18) are surrounded by the trench wall layer (20) and the trench cap layer (38) in order to form the trench isolation structure. The trench isolation structure can be used for inter-active region and inter-well isolation.

8 Claims, 4 Drawing Sheets

U.S. PATENT DOCUMENTS

| | | | |
|---|---|---|---|
| 4,873,203 | * 10/1989 | Kaga et al. | 437/67 |
| 4,990,463 | * 2/1991 | Mori | 437/52 |
| 5,013,679 | * 5/1991 | Kumagi et al. | 437/52 |
| 5,017,506 | * 5/1991 | Shen et al. | 437/52 |
| 5,049,518 | * 9/1991 | Fuse et al. | 437/52 |
| 5,059,550 | * 10/1991 | Tateoka et al. | 437/67 |
| 5,066,609 | * 11/1991 | Yamamoto et al. | 437/52 |
| 5,075,248 | * 12/1991 | Joon et al. | 437/52 |
| 5,106,774 | * 4/1992 | Hieda et al. | 437/52 |
| 5,156,992 | * 10/1992 | Teng et al. | 437/52 |
| 5,198,383 | * 3/1993 | Teng et al. | 437/52 |
| 5,200,353 | * 4/1993 | Inuishi | 437/52 |
| 5,250,458 | * 10/1993 | Tsukamoto et al. | 437/52 |
| 5,258,321 | * 11/1993 | Shimizu et al. | 437/69 |
| 5,273,928 | * 12/1993 | Tani | 437/52 |

* cited by examiner

METHOD OF FORMING A TRENCH ISOLATION STRUCTURE IN A STACK TRENCH CAPACITOR FABRICATION PROCESS This appln is a con't Ser. No. 08/715,862 filed Dec. 30, 1993 abandoned.

TECHNICAL FIELD OF THE INVENTION

The present invention relates in general to semiconductor fabrication processes and more particularly to a method of forming a trench isolation structure in a stack trench capacitor fabrication process.

BACKGROUND OF THE INVENTION

Trench isolation structures have received increasing use in integrated circuit device fabrication in order to improve operating characteristics of the integrated circuit device. However, as the need for smaller device size increases, isolation spaces must also be smaller in order to take advantage of the smaller device fabrication techniques. Conventional trench isolation structures are fabricated through LOCOS techniques. However, LOCOS isolation cannot be decreased to lithographic limits. Therefore, it is desirable to have a method of forming a trench isolation structure that can be scaled down to lithographic limits.

SUMMARY OF THE INVENTION

From the foregoing, it may be appreciated that a need has arisen for a trench isolation structure process with a decreased isolation space size. A need has also arisen for a trench isolation process that can be scaled down to lithographic limits.

In accordance with the present invention, a method of forming a trench isolation structure in a stack trench capacitor fabrication process is provided which substantially eliminates or reduces disadvantages and problems associated with conventional trench isolation structure processes.

According to an embodiment of the present invention, there is provided a method of forming a trench isolation structure in a stack trench capacitor fabrication process that includes forming an interface layer onto a semiconductor substrate and forming a buffer layer onto the interface layer. A trench region is formed through the buffer layer, the interface layer, and into the semiconductor substrate. A trench wall layer is formed on the interior walls of the trench region and is in contact with the remaining interface layer on the semiconductor substrate. A trench filler layer is formed within the trench region on the trench wall layer. A storage dielectric is formed on the trench filler layer and within the trench region followed by the forming of a field plate layer on the storage dielectric and within the trench region. A trench cap layer is formed on the field plate layer such that the trench filler layer, the storage dielectric, and the field plate layer are surrounded by the trench cap layer and the trench wall layer.

The method of the present invention provides various technical advantages over conventional trench isolation structure processes. For example, one technical advantage is in forming a trench isolation structure through the use of a stack trench capacitor fabrication process. Another technical advantage is in forming a trench isolation structure with a small isolation space as compared to conventional processes. Yet another technical advantage is in forming a trench isolation structure that is scaled down to lithographic limits. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1A:
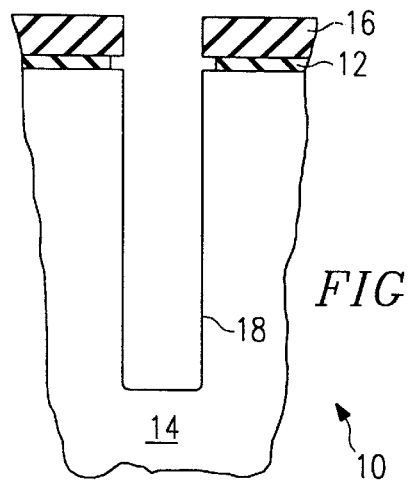
FIGS. 1A–I illustrate a fabrication process for a stack trench capacitor dynamic random access memory cell.
Figure 1B:
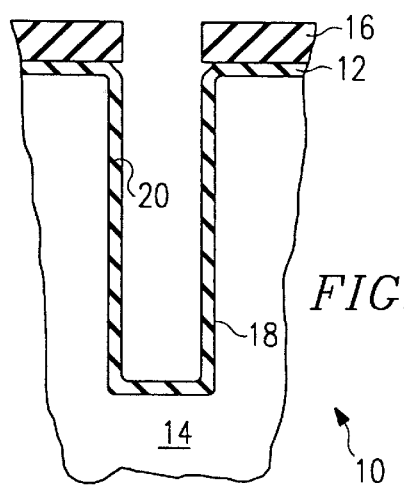

FIGS. 1A–I show a fabrication process for a stack trench capacitor dynamic random access memory cell 10. The fabrication process begins at FIG. 1A where an interface layer 12, preferably made of oxide, is grown on a semiconductor substrate 14. A buffer layer 16, preferably made of nitride, is grown on interface layer 12 and followed by the etching of a trench region 18 through buffer layer 16, interface layer 12, and into semiconductor substrate 14. Proceeding to FIG. 1B, a trench wall layer 20, preferably made of thermal oxide, is grown on inner walls of trench region 18 and connects with interface layer 12. At FIG. 1C, a first photoresist coat 22 is formed within trench region 18 and on trench wall layer 20. A second photoresist coat 24 is formed over a right half portion of photoresist coat 22 and trench wall layer 20. A deglaze process is performed on the structure to remove a portion of trench wall layer 20 at an edge 26 of trench region 18.

Figure 1C:
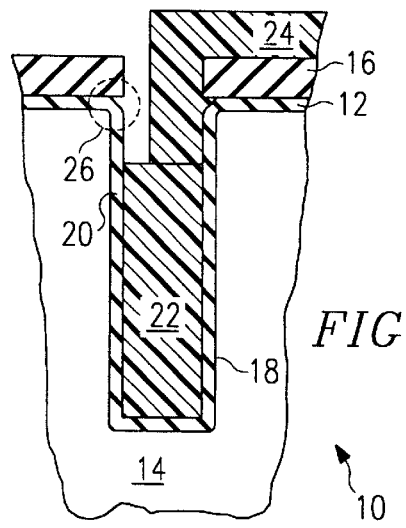
Figure 1D:
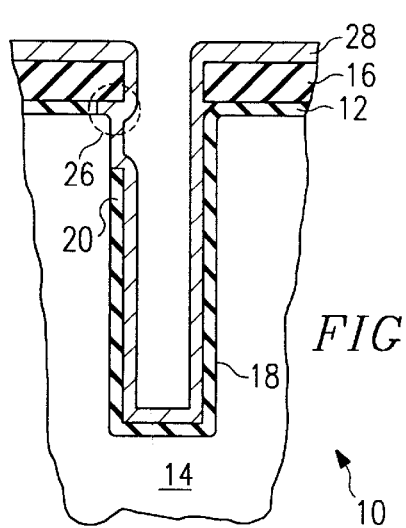
Figure 1E:
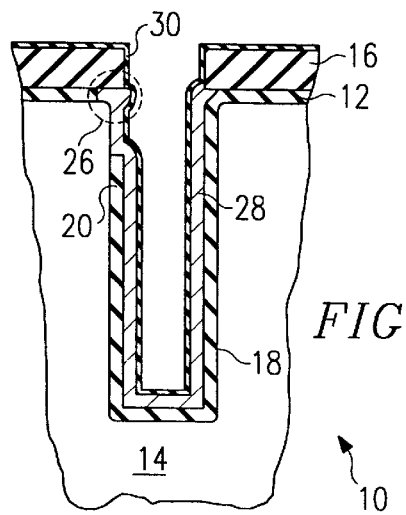
Figure 1F:
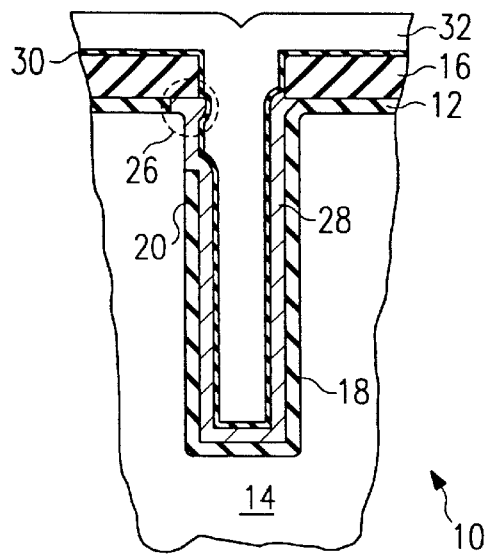
Figure 1G:
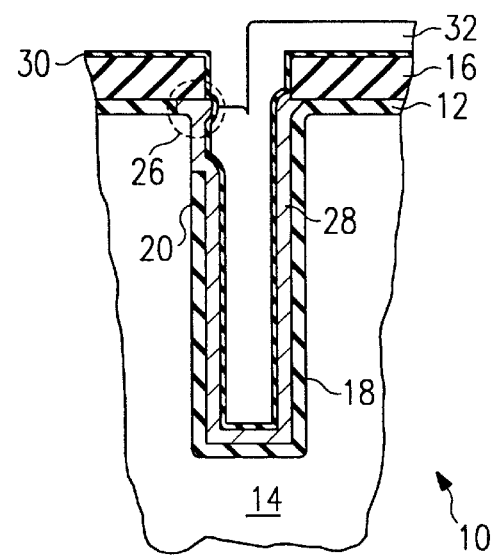

After removing photoresist coats 24 and 22, a trench filler layer 28, preferably made of polysilicon, is deposited on trench wall layer 20, buffer layer 16, and semiconductor substrate 14 at edge 26 as shown in FIG. 1D. Portions of trench filler layer 28 are removed from buffer layer 16 and a storage dielectric 30 is deposited on trench filler layer 28 within trench region 18 and on buffer layer 16 as shown in FIG. 1E. A field plate layer 32, preferably made of polysilicon, is then deposited on storage dielectric 30 as shown in FIG. 1F. A portion of field plate layer 32 is removed from storage dielectric 30 in the vicinity of edge 26 as shown in FIG. 1G. The process continues in FIG. 1H as an oxidized layer 34 is formed on field plate layer 32 and storage dielectric 30 followed by a nitride layer 36 deposited on oxidized layer 34 and storage dielectric 30. The completion of the process is shown in FIG. 1I where nitride layer 36 is removed such that a portion of nitride layer 36 remains on oxidized layer 34. Buffer layer 16 and oxide layer 12 are deglazed away to allow for growth of a gate interface layer 38, preferably made of oxide, deposition of a block layer 40, preferably made of polysilicon, and implantation of source/drain regions 42. The resulting structure shown in FIG. 1I becomes a stack trench capacitor dynamic random access memory cell.

Figure 1H:
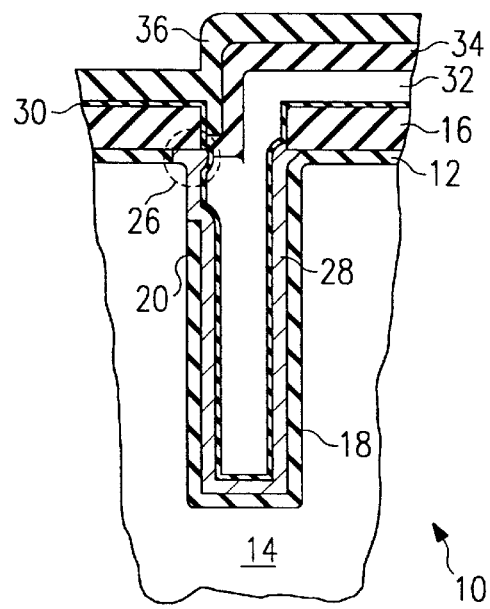
Figure 1I:
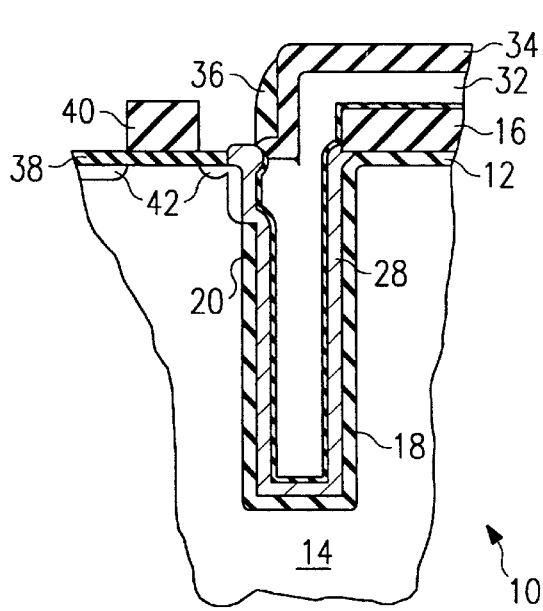
Figure 2A:
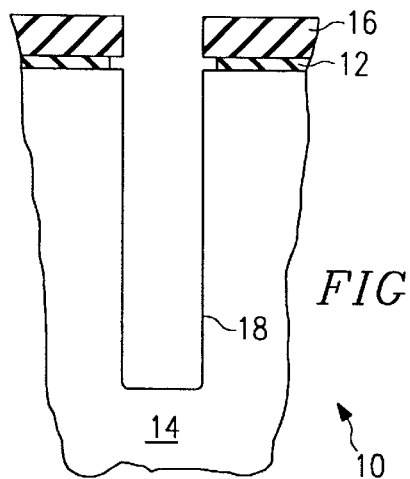
FIGS. 2A–F illustrate a fabrication process for a trench isolation structure.
Figure 2B:
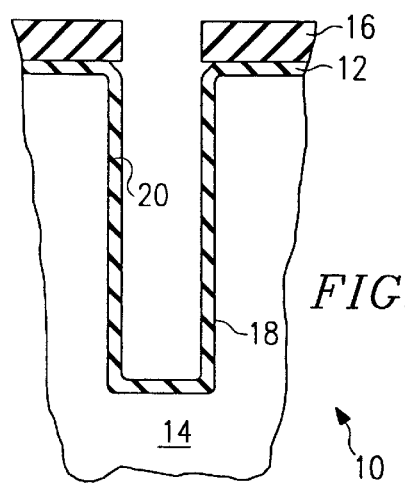

The fabrication process for a stack trench capacitor dynamic random access memory cell can be used to form a trench isolation structure by eliminating the steps depicted in FIG. 1C, FIG. 1H, and FIG. 1I. FIGS. 2A–F show the process for fabricating a trench isolation structure without the steps discussed above in forming the stack trench capacitor dynamic random access memory cell. The process begins at FIG. 2A where oxide layer 12 is grown on semiconductor substrate 14 and nitride layer 16 is grown on oxide layer 12. A trench region 18 is etched through buffer layer 16, oxide layer 12, and into semiconductor substrate 14. FIG. 2B shows the formation of thermal oxide layer 20 within trench region 18 and in contact with oxide layer 12.

Figure 2C:
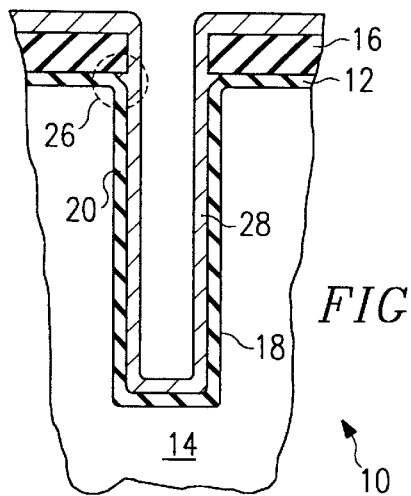
Figure 2D:
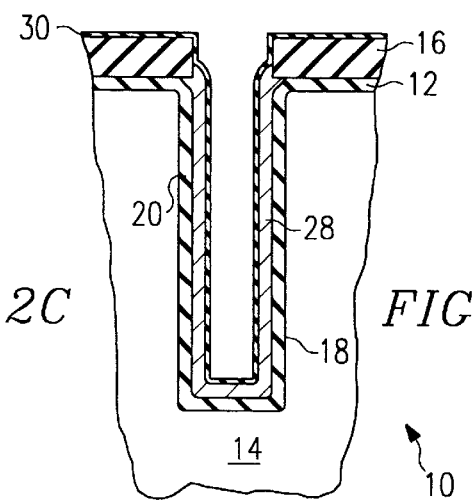
Figure 2E:
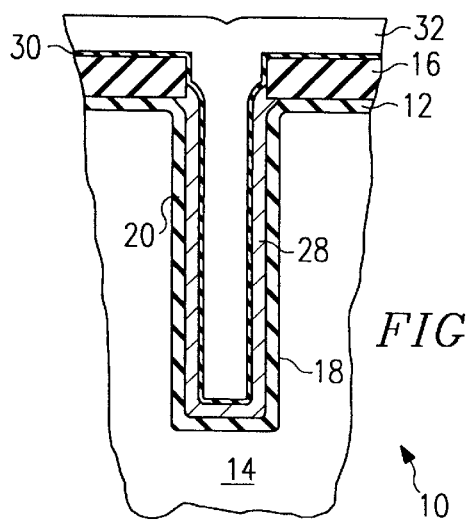
Figure 2F:
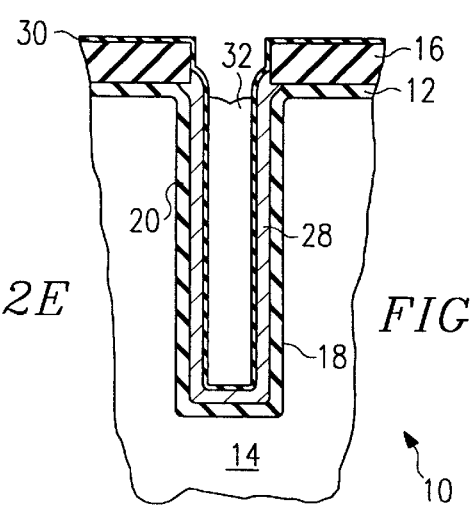

The fabrication process proceeds to FIG. 2C where polysilicon layer 28 is deposited on thermal oxide layer 20 and nitride layer 16, skipping the photoresist patterning step shown in FIG. 1C and preventing edge 26 from being exposed as in the stack trench capacitor fabrication process discussed above. A portion of polysilicon layer 28 is removed from nitride layer 16 and storage dielectric 30 is deposited on nitride layer 16 and polysilicon layer 28 within trench region 18 as shown in FIG. 2D. Field plate polysilicon layer 32 is deposited on storage dielectric 30 and within trench region 18 as shown in FIG. 2E. A portion of field plate polysilicon layer 32 is removed from storage dielectric 30 as shown in FIG. 2F.

To finish the process, exposed areas of storage dielectric 30, nitride layer 16, polysilicon layer 28, and oxide layer 12 outside of trench region 18 are removed and a gate oxide layer 38 is formed on semiconductor substrate 14 and over trench region 18 such that polysilicon layer 28, storage dielectric 30, and field plate polysilicon layer 32 are surrounded by oxide. No additional processing steps are required for forming an isolation space when implemented within a stack trench capacitor fabrication process.

By eliminating the storage node contact at edge 26 of trench region 18, trench region 18 will provide complete isolation of devices on a chip. Such an isolated trench region is suitable for isolating other circuits or devices on the same chip. Further, a small trench depth can be achieved in order to realize very small isolation spaces. For layout intensive circuits, a very tight layout rule is highly desirable. Small isolation spaces on the order of 0.3 μm to 0.5 μm can be realized through this process. Current IOCOS-type isolation techniques only offer a 0.5 μm isolation space. To increase the threshold voltage, additional patterning and trench wall implants may be formed to adjust the dopant concentration along the walls of trench region 18.

Figure 3:
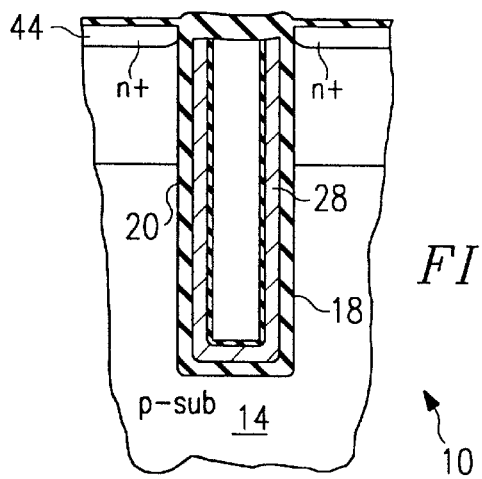
FIG. 3 illustrates the trench isolation structure in an inter-active region isolation.

The trench isolation structure discussed above is useful in inter-active region isolation. FIG. 3 shows an example of how trench region 18 provides the inter-active region isolation. An active region 44 can be implanted on each side of trench region 18 such that the active regions are isolated from each other by trench region 18.

Figure 4:
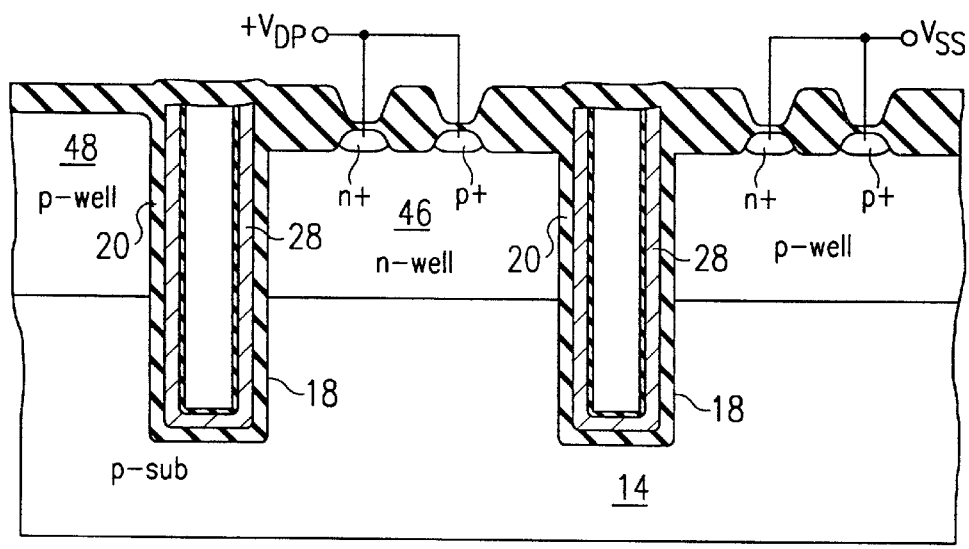
FIG. 4 illustrates the trench isolation structure in an inter-well isolation.

FIG. 4 shows a typical layout in cross-sectional form for an inter-well isolation. The inter-well isolation is useful in preventing latch up that causes a device to remain constantly in the on state. The deep isolated trench regions 18 between an N well region 46 and a P well region 48 are such that the current path must go around trench region 18 in order for latch up to happen. Such a long and detoured current path effectively reduces the gain of the device and increases the immunity of the circuit to latch up problems.

In summary, a process for fabricating a stack trench capacitor dynamic random access memory cell can be modified to form a trench isolation structure. The trench isolation structure can be used for inter-active region isolation and inter-well isolation for latch up prevention.

Thus, it is apparent that there has been provided, in accordance with the present invention, a method of forming a trench isolation structure in a stack trench capacitor fabrication process that satisfies the advantages set forth above. Although the preferred embodiment has been described in detail, it should be understood that various changes, substitutions, and alterations can be made herein. For example, different materials and different formation steps may be employed other than those specifically described in conjunction with the figures. Other examples are readily ascertainable by one skilled in the art and could be made without departing from the spirit and scope of the present invention as defined by the following claims.

What is claimed is:

1. In a method of forming a stack trench capacitor, including the steps of: forming an interface layer onto a semiconductor substrate; forming a buffer layer onto said interface layer; forming a first trench through said interface layer, said buffer layer, and into said semiconductor substrate; forming a trench wall layer on interior walls of said first trench, said trench wall layer being in contact with a remaining interface layer on said semiconductor substrate; removing a portion of said trench wall layer in said first trench; forming a trench filler layer onto said trench wall layer within said first trench; forming a storage dielectric onto said trench filler layer within said first trench; forming a field plate layer onto said storage dielectric within said first trench; a method for forming a trench isolation structure comprising:

forming a second trench through said interface layer, said buffer layer, and into said semiconductor substrate;

forming a trench wall layer on interior walls of said second trench, said trench wall layer being in contact with a remaining interface layer on said semiconductor substrate;

forming a trench filler layer onto said trench wall layer within said second trench;

forming a storage dielectric onto said trench filler layer within said second trench;

forming a field plate layer onto said storage dielectric within said second trench; and forming a trench cap layer on said field plate layer in said second trench such that said trench filler layer, said storage dielectric, and said field plate layer are surrounded by said trench wall layer and said trench cap layer in said second trench.

2. The method of claim 1, further comprising the step of:

forming active regions either side of said trench isolation structure such that said trench isolation structure provides inter-active region isolation.

3. In a method of making a DRAM a method of making a trench isolation structure formed in a stack trench capacitor fabrication process, comprising the steps of:

forming an interface layer onto a semiconductor substrate;

forming a buffer layer onto the interface layer;

forming a trench region through the interface layer, the buffer layer, and into the semiconductor substrate;

forming a trench wall layer on interior walls of the trench region, the trench wall layer being in contact with a remaining interface layer on the semiconductor substrate;

forming a trench filler layer onto the trench wall layer within the trench region;

forming a storage dielectric onto the trench filler layer within the trench region;

forming a field plate layer onto the storage dielectric within the trench region;

forming a trench cap layer on the field plate layer such that the trench filler layer, the storage dielectric, and the field plate layer are surrounded by the trench wall layer and the trench cap layer; and forming a well structure on either side of the trench isolation structure such that said trench isolation structure provides inter-well isolation.

4. The method of claim 3, wherein said trench isolation structure is sufficiently deep enough to prevent circuit latch up.

5. The method of claim 1 wherein said interface layer comprises silicon dioxide.

6. The method of claim 1 wherein said buffer layer comprises silicon nitride.

7. The method of claim 1 wherein said trench filler layer comprises polycrystalline silicon.

8. The method of claim 1 wherein said field plate layer comprises polycrystalline silicon.

* * * * *